US009829511B1

(12) United States Patent
Bayarena

(10) Patent No.: US 9,829,511 B1
(45) Date of Patent: Nov. 28, 2017

(54) DIODE CHECKER

(71) Applicant: The United States of America, as Represented by the Secretary of the Navy, Washington, DC (US)

(72) Inventor: Phillip Bayarena, Ridgecrest, CA (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 176 days.

(21) Appl. No.: 14/852,977

(22) Filed: Sep. 14, 2015

(51) Int. Cl.
*G01R 1/00* (2006.01)
*G01R 15/12* (2006.01)
*G01R 31/26* (2014.01)

(52) U.S. Cl.
CPC ....... *G01R 15/125* (2013.01); *G01R 31/2632* (2013.01)

(58) Field of Classification Search
None
See application file for complete search history.

(56) References Cited

U.S. PATENT DOCUMENTS

| 2,668,943 | A | * | 2/1954 | Wilson | G01R 31/2632 |
| | | | | | 324/762.07 |
| 5,578,936 | A | * | 11/1996 | Gibson | G01R 31/2632 |
| | | | | | 324/762.07 |
| 2003/0133491 | A1 | * | 7/2003 | Shih | G01K 7/01 |
| | | | | | 374/163 |
| 2009/0128124 | A1 | * | 5/2009 | Garland | G01R 15/125 |
| | | | | | 324/115 |
| 2010/0327872 | A1 | * | 12/2010 | Chen | G01R 31/2642 |
| | | | | | 324/414 |
| 2012/0043990 | A1 | * | 2/2012 | Xie | G01R 31/2632 |
| | | | | | 324/762.07 |
| 2013/0236087 | A1 | * | 9/2013 | Lee | G01R 31/2601 |
| | | | | | 382/149 |

FOREIGN PATENT DOCUMENTS

CN           101587163 A     * 11/2009

OTHER PUBLICATIONS

Measuring resistance with a voltmeter and an ammeter, http://practicalphysics.org/measuring-resistance-voltmeter-and-ammeter.html, 2006.*

* cited by examiner

*Primary Examiner* — Patrick Assouad
*Assistant Examiner* — Demetrius Pretlow
(74) *Attorney, Agent, or Firm* — James M. Saunders

(57) ABSTRACT

Embodiments of the invention are directed to using a DC multimeter configured for checking device amperage. A DC voltmeter is electrically-connected in series with the DC multimeter. A linear circuit is electrically connected in series between the DC multimeter and the DC voltmeter. A device under test is electrically-connected between positive and negative terminals of the DC voltmeter.

7 Claims, 2 Drawing Sheets

DIODE CHECKER

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor.

FIELD OF THE INVENTION

The invention generally relates to component testing devices and, more particularly, to diode testing devices.

Figure 1:
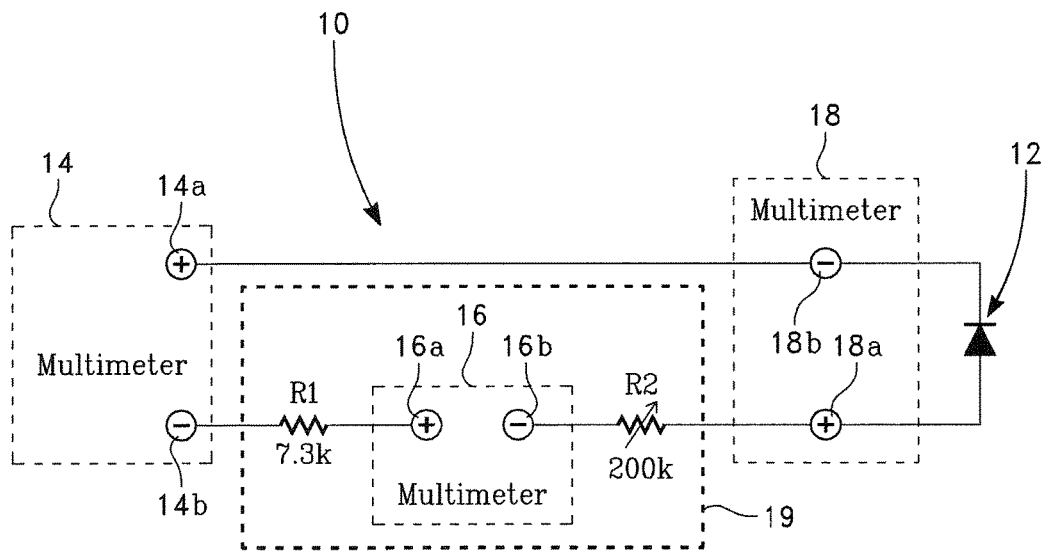
FIG. 1 is an exemplary circuit diagram, according to some embodiments of the invention.

It is to be understood that the foregoing general description and the following detailed description are exemplary and explanatory only and are not to be viewed as being restrictive of the invention, as claimed. Further advantages of this invention will be apparent after a review of the following detailed description of the disclosed embodiments, which are illustrated schematically in the accompanying drawings and in the appended claims.

DETAILED DESCRIPTION OF EMBODIMENTS OF THE INVENTION

Embodiments of the invention may be understood more readily by reference in the following detailed description taking in connection with the accompanying figures and examples. It is understood that embodiments of the invention are not limited to the specific devices, methods, conditions or parameters described and/or shown herein, and that the terminology used herein is for the purpose of describing particular embodiments by way of example only and is not intended to be limiting of the claimed embodiments. Also, as used in the specification and appended claims, the singular forms "a," "an," and "the" include the plural.

Embodiments relate to an apparatus and method for checking diodes, including radio frequency (RF) diodes. Embodiments of the invention may be referred to as a diode checker, diode match maker, a low-current diode checker, a low-current diode match maker, a low current radio frequency diode checker, a low current radio frequency diode match maker, and numerous other variations. Embodiments of the invention are particularly useful in some testing environments, including on ranges where numerous types of tests are conducted, including various forms of flight testing.

In particular, it is beneficial to operate diodes within a range of about 40 to 90 microamps. In the past, specialized test equipment was used to test diodes. Specialized equipment, of course, can be very expensive. Diodes can fail for a variety of reasons, including voltage spikes, current spikes, and general wear and tear.

In particular, diodes have failed in Superhetrodyne receivers when trying to match current. For example, personnel must match a diode "B" to a diode "A," which is supplied by a diode supplier. One solution identified by embodiments of the invention include using a common multimeter combined with a voltage divider with a current meter inline. In some embodiments, a diode with voltmeter is used to bias the diode, which is understood to mean running current through the diode. Some embodiments employ a voltage divider and a rotary switch. Thus, the goal is to match diodes, which one may consider as a technique of low current match making. A person having ordinary skill in the art will recognize that a "low current environment" in sometimes used synonymously with "low voltage environment." Similarly, a person having ordinary skill in the art will recognize that a low voltage environment is defined as less than or equal to 28 V. Conversely, a high voltage environment is defined as greater than 28 V.

Although embodiments of the invention are described in considerable detail, including references to certain versions thereof, other versions are possible. Examples of other versions include performing alternate combinations and sequencing of the components to optimize performance based on specific operating environments. Therefore, the spirit and scope of the appended claims should not be limited to the description of versions included herein.

Figure 2:
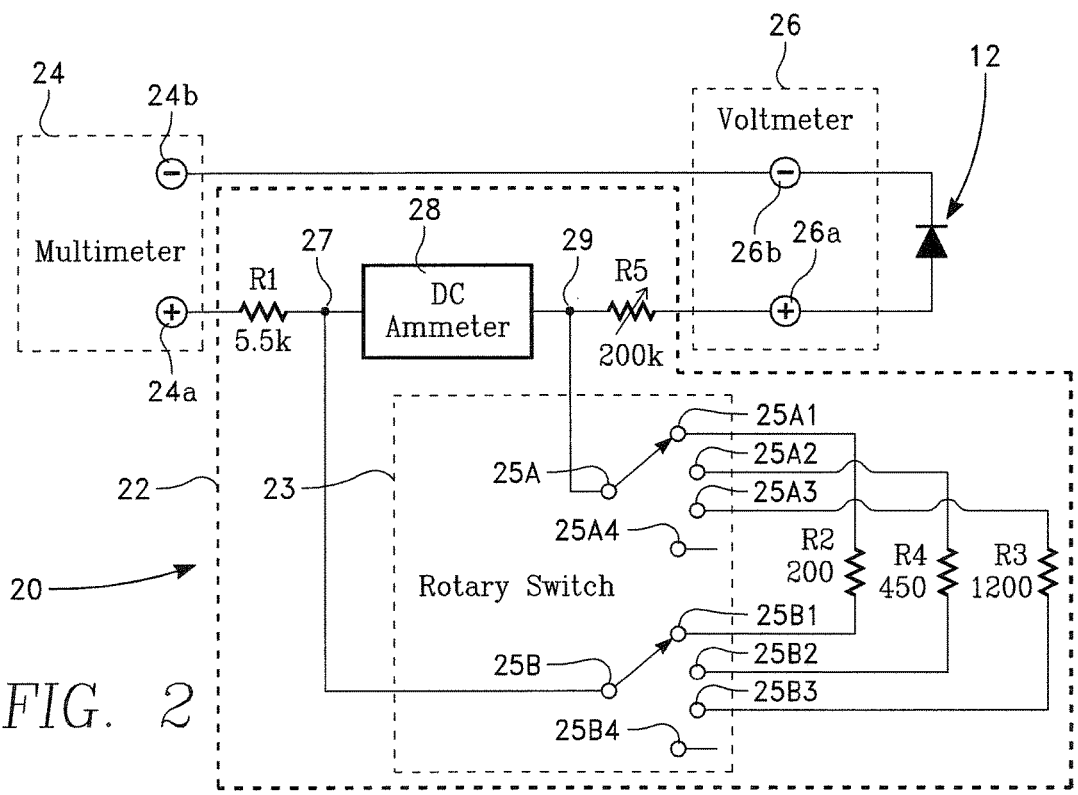
FIG. 2 is an exemplary circuit diagram, according to some embodiments of the invention.
Figure 3:
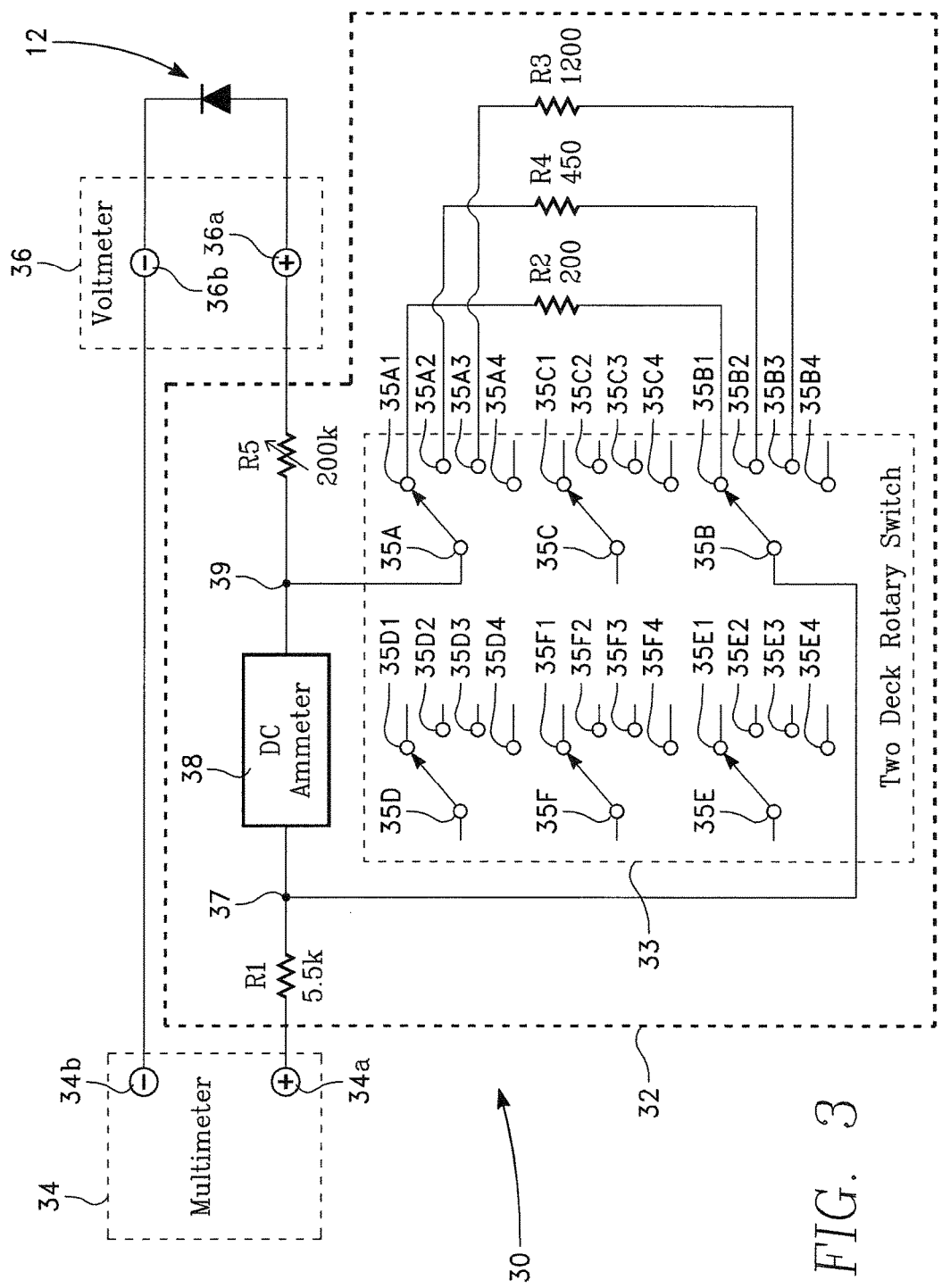
FIG. 3 is an exemplary circuit diagram, according to some embodiments of the invention.

In the accompanying drawings, like reference numbers indicate like elements. FIGS. 1 through 3 illustrate exemplary circuit diagrams, according to embodiments of the invention. Reference characters 10, 20, and 30 are directed to the embodiments shown in FIGS. 1, 2, and 3, respectively.

Apparatus Embodiments

Embodiments make use of standard electrical nomenclature, unless noted. For instance, direct current is abbreviated as DC. Voltage is abbreviated as V. Current is abbreviated as A for amps. Resistance, measured in ohms is sometimes abbreviated as Ω. An embodiment shown in FIG. 1 depicts a device checker (reference character 10). The device checker 10 includes a first DC multimeter 14. The first DC multimeter 14 provides source voltage. The first DC multimeter 14 has a positive terminal 14a which may be considered the source. The first DC multimeter 14 has a negative terminal 14b.

A second DC multimeter 18 is electrically-connected in series with the first DC multimeter 14. The second DC multimeter 18 has a positive terminal 18a and a negative terminal 18b. Both the first and second DC multimeters 14 & 18 are configured for checking device amperage.

A linear circuit 19 is electrically-connected in series between the negative terminal 14b of the first DC multimeter 14 and the positive terminal 18a of the second multimeter 18. A device under test (DUT) 12 is electrically-connected between the positive 18a and negative 18b terminals of the second DC multimeter 18. The DUT 12 is a diode. In some embodiments, the DUT 12 is a radio frequency diode. The linear circuit 19 is a voltage divider.

As shown in FIG. 1, the linear circuit 19 has a first resistor, R1, electrically connected in series to a third DC multimeter 16. The third DC multimeter has a positive and a negative terminal 16a & 16b. The first resistor, R1, is electrically connected in series between the negative terminal 14b of the first DC multimeter 14 and the positive terminal 16a of the third DC multimeter 16. A second resistor, R2, is electrically-connected in series between the negative terminal 16b of the third DC multimeter 16 and the positive terminal 18a of the second DC multimeter 18.

As shown in FIG. 1, the first resistor, R1, is a 7.3 kiliohm resistor. The second resistor, R2, is a variable resistance 200 kiliohm resistor. Based on this, one having ordinary skill in the art will recognize that the DUT 12 can be matched to a particular amperage for diodes that turn on from 0 to 100 microamps, commonly abbreviated as 0 to 100 µA. A microamp is understood in the art to be 1×10$^{-6}$ A.

In another embodiment shown in FIG. 2, a circuit diagram of a device checker 20 is depicted. The device checker 20 includes a DC multimeter 24 configured to check device amperage. The DC multimeter 24 has a positive terminal 24a and a negative terminal 24b. The DC multimeter 24 provides source voltage and, thus, its positive terminal 24a is considered the source. A DC voltmeter 26 is electrically-connected in series with the DC multimeter 24. The DC voltmeter 26 has a positive terminal 26a and a negative terminal 26b. The DC voltmeter's (26) negative terminal 26b is considered common. The DC voltmeter 26 has a range of about 0 to 2 $V_{DC}$.

A linear circuit 22 is electrically-connected in series between the positive terminal 24a of the DC multimeter 24 and the positive terminal 26a of the DC voltmeter 26. A device under test (DUT) 12 electrically-connected between the positive 26a and negative terminals 26b of the DC voltmeter 26. The DUT 12 is a diode. In some embodiments, the DUT 12 is a radio frequency diode. The linear circuit 22 is a voltage divider.

As shown in FIG. 2, the linear circuit 22 has a first resistor, R1, electrically connected in series to a DC ammeter 28. A rotary switch 23 is electrically-connected in parallel with the DC ammeter 28. As shown in FIG. 2, the rotary switch has two poles (shown as reference characters 25A & 25B), which may be referred to as a first pole and a second pole or as a first switch and a second switch. If preferred, the first and second switches 25A & 25B may, instead, be referred to as sub-switches for nomenclature variance. Reference characters 27 and 29 are junction points that connect the rotary switch 23 in parallel with the DC Ammeter 28. As illustrated, the junction points 27 & 29 are electrically connected to the two poles/sub-switches 25A & 25B.

The rotary switch 23 is a single dial that is turned by a user to adjust resistances. The dial is not shown in FIG. 2 for ease of viewing. A pair of levers may, instead, be employed in place of a dial. The rotary switch 23 has, via sub-switches 25A & 25B, four contacts (25A1 through 25A4 & 25B1 through 25B4) on each sub-switch, corresponding to four positions on each sub-switch. As shown on FIG. 2, the rotary switch 23 has a first position (reference character 25A1 & 25B1), a second position (25A2 & 25B2), a third position (25A3 & 25B3), and a fourth position (25A4 & 25B4).

FIG. 2 depicts the rotary switch in its first position because the first and second sub-switches 25A & 25B are each directed to its respective first contact 25A1 & 25B1. The rotary switch in its first position directs current through a second resistor, R2. Similarly, when the rotary switch closes contact with the second contact 25A2 & 25B2, the rotary switch is in its second position and directs current through a fourth resistor, R4. Likewise, when the rotary switch closes contact with the third contact 25A3 & 25B3, the rotary switch is in its third position and directs current through a third resistor, R3.

As shown in FIG. 2, a fourth position corresponds to the rotary switch being in its fourth position, which corresponds to no resistance. A fifth resistor, R5, is electrically connected in series between the junction point 29 and the positive terminal 26a of the DC voltmeter 26.

In the embodiment depicted in FIG. 2, the first resistor, R1, is a 5.5 kiliohm resistor. The second resistor, R2, is a 200 ohm resistor at a 1 milliamp scale. The third resistor, R3, is a 1200 ohm resistor at a 250 microamp scale. The fourth resistor, R4, is a 450 ohm resistor at a 500 microamp scale. The fifth resistor, R5, is a variable resistance 200 kiliohm resistor. Based on this, one having ordinary skill in the art will recognize that the DUT 12 can be matched to a particular amperage by switching the rotary switch 23, thereby varying the resistance.

The embodiment shown in FIG. 3, depicted with reference character 30, is directed to a prototype model constructed for field use and based on what was available. The concepts employed in the FIG. 3 embodiment is similar to FIG. 2, however the FIG. 3 embodiment offers the potential for expansion, which would be use in instances where higher currents would be experienced—such as in a high voltage scenario.

FIG. 3 illustrates a circuit diagram of the device checker 30. The device checker 30 includes a DC multimeter 34 configured to check device amperage. The DC multimeter 34 has a positive terminal 34a and a negative terminal 34b. The DC multimeter 34 provides source voltage and, thus, its positive terminal 34a is considered the source. A DC voltmeter 36 is electrically-connected in series with the DC multimeter 34. The DC voltmeter 36 has a positive terminal 36a and a negative terminal 36b. The DC voltmeter's (36) negative terminal 36b is considered common. The DC voltmeter 36 has a range of about 0 to 2 $V_{DC}$.

A linear circuit 32 is electrically-connected in series between the positive terminal 34a of the DC multimeter 34 and the positive terminal 36a of the DC voltmeter 36. A device under test (DUT) 12 electrically-connected between the positive 36a and negative terminals 36b of the DC voltmeter 36. The DUT 12 is a diode. In some embodiments, the DUT 12 is a radio frequency diode. The linear circuit 32 is a voltage divider.

As shown in FIG. 3, the linear circuit 32 has a first resistor, R1, electrically connected in series to a DC ammeter 38. A rotary switch 33 is electrically-connected in parallel with the DC ammeter 38. As shown in FIG. 3, the rotary switch has two active poles (shown as reference characters 35A & 35B), which may be referred to as a first pole and a second pole or as a first switch and a second switch. If preferred, the first and second switches 35A & 35B may, instead, be referred to as sub-switches for nomenclature variance. Reference characters 37 and 39 are junction points that connect the rotary switch 33 in parallel with the DC Ammeter 38. As illustrated, the junction points 37 & 39 are electrically connected to the two poles/sub-switches 35A & 35B.

The rotary switch 33 is a single dial that is turned by a user to adjust resistances. The dial is not shown in FIG. 3 for ease of viewing. Levers may, instead, be employed in place of a dial. The rotary switch 33 has, via sub-switches 35A & 35B, four contacts (35A1 through 35A4 & 35B1 through 35B4) on each sub-switch, corresponding to four positions on each sub-switch. As shown on FIG. 3, the rotary switch 33 has a first position (reference character 35A1 & 35B1), a second position (35A2 & 35B2), a third position (35A3 & 35B3), and a fourth position (35A4 & 35B4).

FIG. 3 depicts the rotary switch in its first position because the first and second sub-switches 35A & 35B are each directed to its respective first contact 35A1 & 35B1. The rotary switch in its first position directs current through a second resistor, R2. Similarly, when the rotary switch closes contact with the second contact 35A2 & 35B2, the rotary switch is in its second position and directs current through a fourth resistor, R4. Likewise, when the rotary switch closes contact with the third contact 35A3 & 35B3, the rotary switch is in its third position and directs current through a third resistor, R3.

As shown in FIG. 3, a fourth position corresponds to the rotary switch being in its fourth position, which corresponds to no resistance. A fifth resistor, R5, is electrically connected in series between the junction point 39 and the positive terminal 36a of the DC voltmeter 36.

In the embodiment depicted in FIG. 3, the first resistor, R1, is a 5.5 kiliohm resistor. The second resistor, R2, is a 200 ohm resistor at a 1 milliamp scale. The third resistor, R3, is a 1200 ohm resistor at a 250 microamp scale. The fourth resistor, R4, is a 450 ohm resistor at a 500 microamp scale. The fifth resistor, R5, is a variable resistance 200 kiliohm resistor. Based on this, one having ordinary skill in the art will recognize that the DUT 12 can be matched to a particular amperage by switching the rotary switch 33, thereby varying the resistance.

It is apparent to a person having ordinary skill in the art that the embodiment shown in FIG. 3 offers the opportunity for expansion, if needed. Additional poles/switches are depicted using reference characters 35C, 35D, 35E, and 35F along with the respective corresponding contacts depicted with reference characters 35C1 through 35F4. A person having ordinary skill in the art will recognize that the rotary switch 33 in FIG. 3 is a two-deck, triple pole rotary switch, which provides more physical space for switching (if needed).

Using Embodiments of the Invention

In embodiments, the DC multimeters (14, 24, & 34) are configured in diode testing mode. The DUT 12 has an amperage range of about 40 microamps to about 90 microamps. Stated another way, a user of embodiments of the invention has a goal of matching a diode to an amperage range of about 40 microamps to about 90 microamps.

Upon connecting the components using standard patch cords, and powering up the source the source (the DC multimeters depicted with reference characters 14, 24, and 34), the user adjusts the multimeters to operate in diode mode (diode checking mode). The user then adjusts current using the rotary switch. User selection of the rotary switch (23 & 33) allows the user to match diodes. Additionally, the second, third, and fourth resistors (R2, R3, & R4) are scalars configured to protect the DC Ammeter. The variable resistance resistor (R5) is configured to adjust the current level within the scale of the readable range of the DC Ammeter 28 & 38. This assures that the DC Ammeter 28 & 38 is reading properly. Upon diode matching, a pair of matching diodes is used in the receiver systems.

In all embodiments, a project box may be implemented to house the circuitry and protect it from damage caused by weather and being dropped. A person having ordinary skill in the art will recognize that embodiments of the invention, when used with a project box, can be considered a kit. In particular, the embodiment shown in FIG. 3 was incorporated into a box having dimensions of about 5 inches×7 inches×4 inches.

In the embodiments depicted in FIGS. 2 & 3, the second, third, and fourth resistors (R2, R3, & R4) each have a respective scale. As discussed above, the second resistor, R2, has a resistance of about 200 ohms at a 1 mA (1 milliamp) scale. Thus, when the rotary switch 23 & 33 is in the first position (reference character 25A1/25B1 & 35A1/35B1), the current going to the DC Ammeter 28 & 38 changes from 0 to 1 mA. Similarly, the third resistor, R3, has a resistance of about 1200 ohms at a 250 µA scale. Therefore, when the rotary switch 23 & 33 is in the third position (reference character 25A3/25B3 & 35A3/35B3), the current going to the DC Ammeter 28 & 38 changes from 0 to 250 µA. The fourth resistor, R4, has a resistance of about 450 ohms at a 500 µA scale. Therefore, when the rotary switch 23 & 33 is in the second position (reference character 25A2/25B2 & 35A2/35B2), the current going to the DC Ammeter 28 & 38 changes from 0 to 500 µA. Finally, when the rotary switch 23 & 33 is in the fourth position (reference character 25A4/25B4 & 35A4/35B4), the current going to the DC Ammeter 28 & 38 changes from 0 to 100 µA, because the DC Ammeter is a 0 to 100 µA rated ammeter.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

What is claimed is:

1. A device checker, comprising:
   a DC multimeter configured for checking device amperage, said DC multimeter having a positive terminal and a negative terminal;
   a DC voltmeter electrically-connected in series with said DC multimeter, said DC voltmeter having a positive terminal and a negative terminal;
   a linear circuit electrically-connected in series between said positive terminal of said DC multimeter and said positive terminal of said DC voltmeter; and
   a device under test (DUT) electrically-connected between said positive and negative terminals of said DC voltmeter;
   wherein said linear circuit is a voltage divider, comprising:
   a first resistor, R1;
   a DC ammeter electrically-connected in series with said first resistor, R1;
   a rotary switch electrically-connected in parallel with said DC ammeter, said rotary switch having a first position, a second position, a third position, and a fourth position;
   said first position corresponding to a second resistor, R2, said second position corresponding to a fourth resistor, R4, said third position corresponding to a third resistor, R3, and said fourth position corresponding to no resistance; and
   a fifth resistor, R5, electrically-connected in series with said DC ammeter.

2. The device checker according to claim 1, wherein said first resistor, R1, has a resistance of about 5.5 kiliohms.

3. The device checker according to claim 1, wherein said second resistor, R2, has a resistance of about 200 ohms at about a 1 milliamp scale.

4. The device checker according to claim 1, wherein said third resistor, R3, has a resistance of about 1200 ohms at about a 250 microamp scale.

5. The device checker according to claim 1, wherein said fourth resistor, R4, has a resistance of about 450 ohms at about a 500 microamp scale.

6. The device checker according to claim 1, wherein said fifth resistor, R5, has a variable resistance of about 200 kiliohms.

7. The device checker according to claim 1, wherein said DUT is a radio frequency diode.

* * * * *